Figure 1:
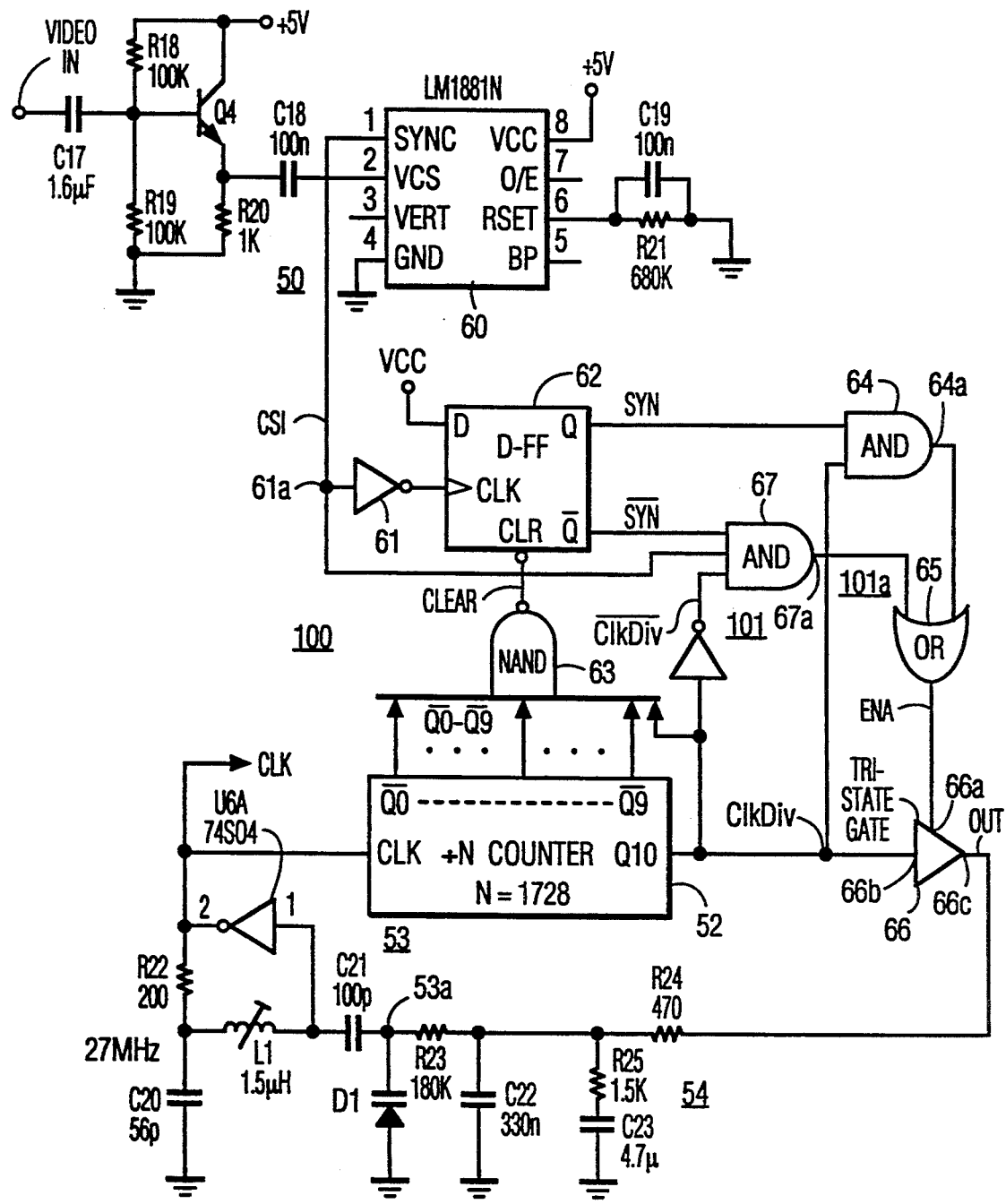

United States Patent [19]
den Hollander

[11] Patent Number: 5,426,397
[45] Date of Patent: Jun. 20, 1995

[54] PHASE DETECTOR FOR A PHASE-LOCK-LOOP

[75] Inventor: Willem den Hollander, Schlieren, Switzerland

[73] Assignee: RCA Thomson Licensing Corporation, Princeton, N.J.

[21] Appl. No.: 276,370

[22] Filed: Jul. 18, 1994

[30] Foreign Application Priority Data

Apr. 7, 1994 [GB] United Kingdom ............. 9406866

[51] Int. Cl.[6] ............................................ H03L 7/085
[52] U.S. Cl. ................................ 331/1 A; 331/20; 331/27; 327/159
[58] Field of Search ............... 331/1 A, 25, 27, 20; 307/516, 514; 328/133, 134

[56] References Cited

U.S. PATENT DOCUMENTS

| | | | |
|---|---|---|---|
| 4,278,903 | 7/1981 | Ichinose | 307/514 |
| 4,291,274 | 9/1981 | Suzuki et al. | 328/133 |
| 4,316,150 | 2/1982 | Crosby | 331/1 A |
| 4,371,974 | 2/1983 | Dugan | 375/82 |
| 4,400,664 | 8/1983 | Moore | 324/83 D |
| 4,484,142 | 11/1984 | Rub et al. | 328/155 |
| 4,520,319 | 5/1985 | Baker | 328/133 |
| 4,527,080 | 7/1985 | Zweig | 307/510 |
| 4,568,881 | 2/1986 | Kostrov | 328/109 |
| 4,593,253 | 6/1986 | McCabe et al. | 331/1 A |
| 4,594,563 | 6/1986 | Williams | 331/1 A |
| 4,598,217 | 7/1986 | Predina et al. | 307/525 |
| 4,599,570 | 7/1986 | Cloke | 328/155 |
| 4,734,630 | 3/1988 | Okano | 318/608 |
| 4,749,937 | 6/1988 | Simons | 324/83 D |
| 4,804,928 | 2/1989 | Chloupek et al. | 331/1 A |
| 4,819,081 | 4/1989 | Volk et al. | 328/134 |
| 4,843,332 | 6/1989 | Cok et al. | 328/133 |
| 4,849,704 | 7/1989 | Thornton | 328/133 |
| 4,851,784 | 7/1989 | Wells et al. | 328/133 |
| 4,868,512 | 9/1989 | Bridgman | 328/133 |
| 4,884,020 | 11/1989 | Blakeslee | 324/83 D |
| 4,940,952 | 7/1990 | Kegasa | 331/27 X |
| 4,970,469 | 11/1990 | Kasperkovitz | 329/325 |

*Primary Examiner*—Siegfried H. Grimm
*Attorney, Agent, or Firm*—Joseph S. Tripoli; Joseph J. Laks; Sammy S. Henig

[57] ABSTRACT

A phase-lock-loop circuit for generating a clock signal at a frequency higher than a horizontal frequency of a video signal includes a phase detector. The phase detector includes a flip-flop that is set when a horizontal sync pulse occurs. An output of a counter that provides frequency division is decoded for resetting the flip-flop in each horizontal period. Other than for the flip-flop, and for the counting stages of the counter, only combinational logic components are used for producing a phase error indicative signal that is coupled via a low-pass filter to a control input of an oscillator of the phase-lock-loop circuit.

18 Claims, 2 Drawing Sheets

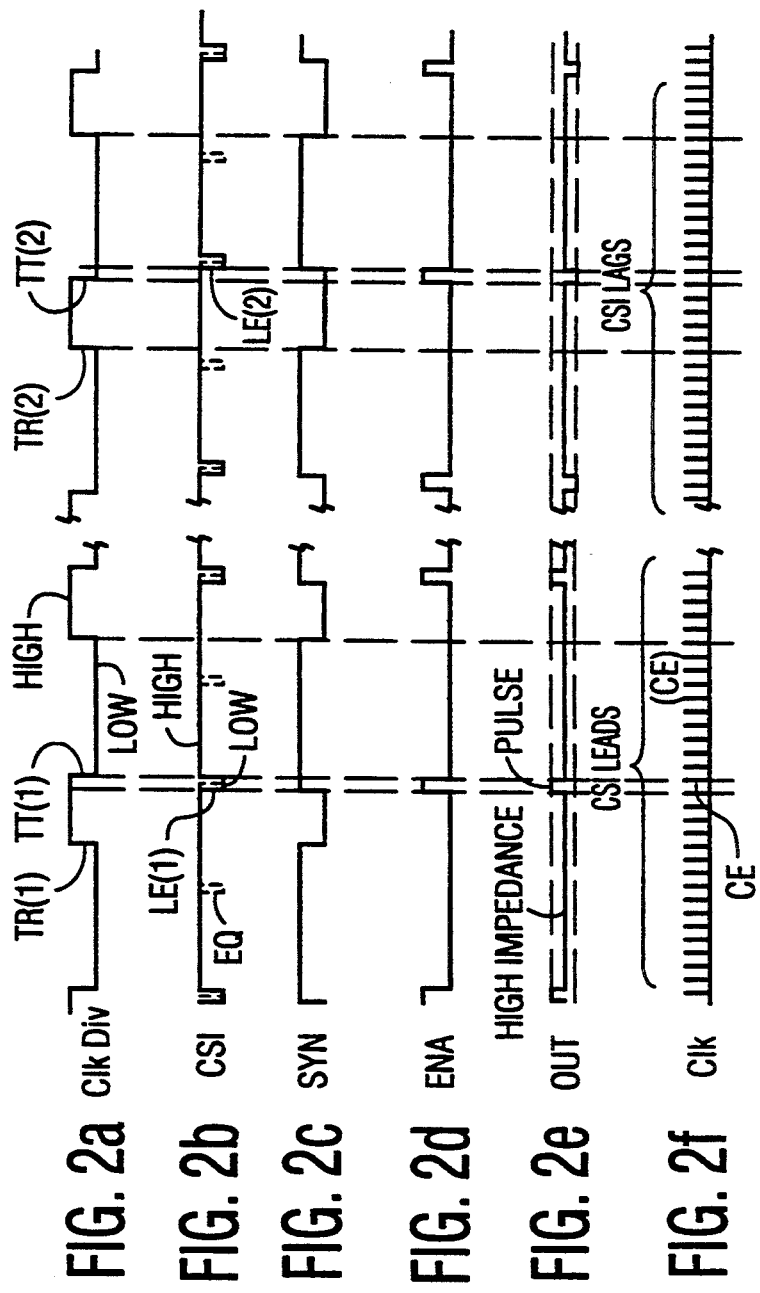

PHASE DETECTOR FOR A PHASE-LOCK-LOOP

The invention relates to an arrangement for generating a phase-lock-loop clock signal.

Digital video signal processing systems with features such as on-screen display of text and picture-in-picture for both television receiver and video tape recorder signal sources may require a clock signal that is phase-locked to a horizontal synchronization signal, referred to as line-locked clock. Typically, a phase-locked loop (PLL) system is formed for line-locked clock generation. Typically, such PLL requires a phase detector and a counter.

It may be desirable to produce in a phase detector a phase error indicative signal that is independent of a duty cycle of the horizontal synchronization signal. It may also be desirable to generate the clock signal such that, in phase-lock condition, the edges of the clock and synchronization signals are aligned or occur approximately simultaneously. It may be further desirable to generate the phase error indicative signal such that the horizontal synchronization signal is applied to only one flip-flop in the phase detector and no signal path of the synchronizing signal includes another flip-flop in the phase detector. Thus, only one flip-flop is utilized both when the phase error is positive and negative. Thereby, the circuitry of the phase detector is simplified.

A phase-lock-loop circuit, embodying an aspect of the invention, includes a controllable oscillator and a source of a synchronizing signal. A flip-flop is responsive to the synchronizing signal for generating a flip-flop output signal at a first state when an edge of the synchronizing signal occurs. The output signal alternates between the first state and a second state. A decoder is used for applying the synchronizing signal to an output of said decoder via a signal path of the synchronizing signal that includes the flip-flop. A phase difference indicative signal is generated at the output of the decoder. The phase difference indicative signal is generated in accordance with a phase difference between the synchronizing signal and an output signal of the oscillator. For phase difference that are both positive and negative, no other flip-flop is included in any signal path of the synchronizing signal between the source of synchronizing signal and the output of the decoder. A low-pass filter is responsive to the phase difference indicative signal and coupled to a control input of the oscillator for controlling the oscillator in a phase-lock-loop manner. In steady state phase-lock operation, an edge of the oscillator output signal is aligned with the edge of the synchronizing signal.

FIG. 1 illustrates partially in a block diagram a phase-lock loop (PLL), including a phase detector, embodying an aspect of the invention; and FIGS. 2a–2f are waveforms useful for explaining the operation of the PLL of FIG. 1.

FIG. 1 illustrates a block diagram of a phase-lock loop circuit (PLL) 100, including a phase detector 101, embodying an aspect of the invention. A baseband luminance video signal VIDEO-IN obtained from, for example, a video detector, not shown, of a television receiver is coupled to a conventional sync separator 50 that generates pulses of a horizontal sync signal CSI having a period H at a horizontal deflection frequency $f_H$ that is in, for example, the NTSC standard 15,734 Hz.

An output signal ClkDiv is produced at an output Q10, the most significant bit of eleven outputs Q0–Q10 of a divide-by-N binary counter 52, by frequency dividing an oscillatory output signal Clk of PLL 100 produced in a voltage-controlled-oscillator 53. Signal Clk may be used in various stages, not shown, of the television receiver for video signal processing. In steady state operation, the frequency of signal Clk is equal to $N \times f_H$. The value N denotes a ratio between the frequency of signal Clk and that of signal ClkDiv. The value N may be, for example, equal to 1716.

FIGS. 2a–2f illustrate waveforms useful for explaining the operation of the circuit diagram of FIG. 1. Similar symbols and numerals in FIGS. 1 and 2a–2f indicate similar items or functions.

A clear input CLR of a storage element or D-type flip-flop 62 of FIG. 1 receives a clear signal CLEAR at a LOW state developed at an output of a NAND gate 63. Signal CLEAR is developed, in a given period H of counter 52, when each of the ten least significant inverting signals developed at outputs $\overline{Q0}$–$\overline{Q9}$ is at a HIGH state and signal ClkDiv, the most significant bit that is developed at non-inverting output Q10, is at a HIGH state. Thus, at a time TR(1) or TR(2) of FIG. 2a, signal CLEAR of FIG. 1 attains the LOW state. When signal CLEAR is at the LOW state, flip-flop 62 is latched to a reset state in which an output Q, where a signal SYN of FIG. 2c is developed, is established at a LOW state and a signal $\overline{SYN}$ developed an inverting output $\overline{Q}$ of flip-flop 62 is at a HIGH state. Signal CLEAR provides initialization of flip-flop 62 in each horizontal period H.

When the television receiver is tuned to receive a station, a leading edge LE(1) or LE(2), having a HIGH-TO-LOW transition, of a pulse of horizontal synchronization signal CSI of FIG. 2b is produced when a horizontal sync pulse occurs in signal VIDEO-IN of FIG. 1. Between the pulses of signal CSI, signal CSI of FIG. 2b is at a HIGH state.

An input D of flip-flop 62 receives a signal VCC at a HIGH state. When leading edge LE(1) or LE(2) of signal CSI of FIG. 2b occurs, edge triggered flip-flop 62 of FIG. 1 is latched to a set state in which output signal SYN of FIG. 2c, developed at non-inverting output terminal Q of flip-flop 62 of FIG. 1, attains a HIGH state. Signal ClkDiv has a trailing edge TC(1) or TC(2) of FIG. 2a that is phase compared to signal SYN of FIG. 2c.

In a first example, leading edge LE(1) shown at the left side of FIG. 2b occurs when signal ClkDiv of FIG. 2a is already at the HIGH state. The first example depicts a situation in which the phase of the pulse of signal CSI of FIG. 2b, as determined by leading edge LE(1), lags the phase of signal ClkDiv of FIG. 2a, as determined by a trailing edge TT(1) of signal ClkDiv. Consequently, an output signal 64a of FIG. 1 of an AND gate 64 that receives signals SYN and ClkDiv is HIGH between edge LE(1) of FIG. 2b and edge TT(1) of FIG. 2a.

Output signal 64a of FIG. 1 is coupled via an OR gate 65 to an enable input 66a of a tri-state gate 66 to develop an enable signal ENA of FIG. 2d at input 66a of FIG. 1. Signal ClkDiv is coupled to an input 66b of gate 66. Signal ENA is at a HIGH state, between the time when edge LE(1) of FIG. 2b occurs and the time when edge TT(1) of FIG. 2a occurs. Therefore, signal ENA of FIG. 1 causes signal ClkDiv that is also at the HIGH state to be coupled to an output 66c of gate 66 for developing an output signal OUT of FIGS. 1 and 2e at the HIGH state.

Thus, a pulse of phase difference indicative signal OUT having a peak at the HIGH state is developed from signal ClkDiv. Immediately prior to and after the interval between edge LE(1) of FIG. 2b and edge TT(1) of FIG. 2a, that establish the pulse width of signal ENA of FIG. 2d, output 66c of FIG. 1 is at a high impedance state. The pulse width of signal OUT is proportional to the phase error or difference. Signal OUT is coupled via a conventional low-pass filter 54 that forms the loop filter of PLL 100 to control input terminal 53a of oscillator 53 for controlling the phase and frequency of signal Clk.

In a second example, leading edge LE(2) shown at the right side of FIG. 2a, occurs when signal ClkDiv of FIG. 2a is already at the LOW state. The second example depicts a situation in which the phase of signal CSI of FIG. 2b, as determined by leading edge LE(2), lags the phase of signal ClkDiv of FIG. 2a as determined by a trailing edge TT(2). Consequently, an output signal 67a of FIG. 1 of an AND gate 67 that receives signals SYN and ClkDiv is HIGH between edge TT(2) of FIG. 2a and edge LE(2) of FIG. 2b.

Output signal 67a of FIG. 1 is coupled via OR gate 65 to enable input 66a of tristate gate 66 for developing enable signal ENA of FIG. 2d at input 66a of FIG. 1. Signal ClkDiv is coupled to input 66b of gate 66. Signal ENA is at a HIGH state, between the time when edge TT(2) of FIG. 2a occurs and the time when edge LE(2) of FIG. 2b occurs. Therefore, signal ENA of FIG. 1 causes signal ClkDiv, that is at the LOW state, to be coupled to output 66c of gate 66. Consequently, output signal OUT of FIGS. 1 and 2e is developed at the LOW state. Thus, a pulse of phase difference indicative signal OUT having a peak at the LOW state is developed.

Immediately prior to and after the interval between edge TT(2) of FIG. 2a and edge LE(2) of FIG. 2b, that establish the pulse width of signal ENA of FIG. 2d, output 66c of FIG. 1 is at the high impedance state. The pulse width of signal OUT is proportional to the phase error or time difference between leading edge LE(2) of FIG. 2b and edge TT(2) of FIG. 2a. Advantageously, signal OUT is independent of the duty cycle of each of signal CSI and signal ClkDiv. Therefore, advantageously, PLL 100 of FIG. 1 is not affected by any variations of the duty cycle of signal CSI that may occur as a result of, for example, noise or signal reception variation.

In phase-lock condition, edge TT(2) or TT(1) of FIG. 2a occurs immediately after or almost simultaneously with a clocking edge CE of signal Clk of FIG. 2f. Thus, the edges of signals Clk and CSI are aligned in phase-lock operation. Having the clocking edge CE of signal Clk of FIG. 2f aligned with edge TT(1) or TT(2) of FIG. 2a may facilitate signal processing in other stages of a video apparatus, not shown, that utilize signal Clk.

In accordance with an inventive feature, signal CSI of FIG. 1 that is coupled to flip-flop 62 is not applied to any other signal storage stage in the course of generating signal OUT. Gates 64, 65, 67 and 66 form a decoder 101a of the phase detector. Decoder 101a is formed entirely from combinational logic stages. Thus, no flip-flop, other than flip-flop 62, is coupled to any signal path formed between terminal 61a where signal CSI is generated and terminal 66c, where signal OUT is generated both when the phase difference is positive and negative. The result of using only one flip-flop is that the circuitry of the phase detector is simplified.

In a third example, the television receiver is not tuned to receive any video signal, resulting in missing signal VIDEO-IN of FIG. 1. The operation of sync separator 60 is such that when no sync pulse is present, such as when the television receiver is not tuned to receive a transmitting station, signal CSI is continuously at a LOW state. Because of the operation of signal CLEAR, flip-flop 62, is at a reset state and signal SYN is at a LOW state. Signal CSI at the LOW state inhibits through gate 67 the generation of signal ENA. When gate 67 is not enabled, as a result of signal ENA not being generated, terminal 66ck is not driven and a high impedance is developed at terminal 66c. Therefore, advantageously, filter 54 and oscillator 53 are not disturbed when, for example, a short duration interruption in signal CSI occurs. Furthermore, when video signal VIDEO-IN is continuously missing, oscillator 53 will operate at a nominal free running frequency.

In accordance with another inventive feature, signal ClkDiv of FIG. 2a has a LOW-TO-HIGH ratio of greater than 1:1, for example, 2:1. Therefore, signal CLEAR of FIG. 1, that occurs when edge TR(1) or TR(2) of FIG. 2a occurs, will cause flip-flop 62 of FIG. 1 to reset following the occurrence of equalizing pulses EQ of FIG. 2b in signal CSI. Consequently, equalizing pulses EQ that occur during vertical retrace will not disturb the operation of PLL 100 because they will have no effect on signal SYN following edge TR(1) or TR(2) of FIG. 2a.

Except for the flip-flop counting stages of counter 52 that are required for frequency division purposes, only one additional flip-flop, flip-flop 62, is required. All the other logic stages of decoder 101a are memory-less or combinational logic stages. As explained before, advantageously, PLL 100 is constructed without additional storage elements, other than flip-flop 62, in any signal path between a terminal 614 where signal CSI is developed and terminal 66c where signal OUT is developed. Thus, flip-flop 62 is the only flip-flop in any signal path of signal CSI both when the phase difference is positive and negative.

What is claimed:
1. A phase-lock-loop circuit, comprising:
    a controllable oscillator;
    a source of a synchronizing signal;
    a flip-flop responsive to said synchronizing signal for generating a flip-flop output signal at a first state when an edge of said synchronizing signal occurs, said output signal alternating between said first state and a second state;
    a decoder for applying said synchronizing signal to an output of said decoder via a signal path of said synchronizing signal that includes said flip-flop to generate a phase difference indicative signal at said output of said decoder, said phase difference indicative signal being generated in accordance with a phase difference between said synchronizing signal and an output signal of said oscillator, such that for phase differences that are both positive and negative, no other flip-flop is included in any signal path of said synchronizing signal between said source of synchronizing signal and said output of said decoder; and
    a low-pass filter responsive to said phase difference indicative signal and coupled to a control input of said oscillator for controlling said oscillator in a phase-lock-loop manner such that in steady state phase-lock operation, an edge of said oscillator output signal is aligned with said edge of said synchronizing signal.

2. An apparatus according to claim 1 further comprising, a counter responsive to said oscillator output signal for frequency dividing said oscillator output signal, said counter being coupled to said decoder for providing timing information of an edge of said oscillator output signal.

3. An apparatus according to claim 2 wherein said counter is coupled to said flip-flop for generating said flip-flop output signal at said second state.

4. A phase-lock-loop circuit according to claim 3 wherein said counter produces a first signal and wherein a pulse width of a pulse of said phase difference indicative signal is determined in accordance with a length of an interval between an instant when said flip-flop output signal assumes said first state in response to said synchronizing signal and an instant when said first signal occurs.

5. A phase-lock-loop circuit according to claim 4 wherein said counter generates a second signal that is time-shifted with respect to said first signal, wherein said synchronizing signal is derived from a video signal and includes a horizontal rate signal and an equalizing pulse between a given pair of pulses of said horizontal rate signal and wherein in a given period of said horizontal rate signal said second signal causes said flip-flop to assume said second state following the occurrence of said equalizing pulse in a manner to prevent said equalizing pulse from affecting said phase difference indicative signal.

6. A phase-lock-loop circuit according to claim 1 wherein a pulse of said phase difference indicative signal is at a first magnitude when said phase difference is positive and at a second magnitude when said phase difference is negative.

7. A phase-lock-loop circuit according to claim 1 further comprising, a counter responsive to said oscillator output signal for generating a first signal at a lower frequency wherein said decoder includes a tri-state gate that couples said first signal of said counter to an output terminal of said gate to develop a pulse of said phase error indicative signal at said output terminal.

8. A phase-lock-loop circuit according to claim 1 further comprising, a counter responsive to said oscillator output signal for generating a first signal that is coupled to said decoder wherein when said synchronizing signal phase-leads said first signal, a pulse of said phase difference indicative signal has a leading edge in response to said flip-flop output signal and a trailing edge in response to the occurrence of said first signal, and when said synchronizing signal phase-lags said first signal, said pulse has a leading edge in response to the occurrence of said first signal and a trailing edge in response to said flip-flop output signal.

9. A phase-lock-loop circuit according to claim 8 wherein said counter generates a second signal that is time-shifted with respect to said first signal for initializing said flip-flop and for causing it to assume said second state in a given period of said synchronizing signal.

10. A phase-lock-loop circuit according to claim 8 wherein said flip-flop is the only memory stage in any signal path between said counter and said output of said decoder.

11. A phase-lock-loop circuit according to claim 1 wherein said synchronizing signal is coupled to said decoder in a manner that bypasses said flip-flop for enabling the generation of said phase error indicative signal in normal operation and for disabling the generation of said phase error indicative signal when said synchronizing signal is missing.

12. A phase-lock-loop circuit, comprising:
a controllable oscillator for generating an oscillatory signal;
a counter responsive to said oscillatory signal for frequency dividing said oscillatory signal to generate first and second signals having a time difference therebetween and that are synchronized to said oscillatory signal, each having a lower frequency than that of said oscillatory signal;
a source of a synchronizing signal;
an edge triggered flip-flop responsive to said synchronizing signal for generating a flip-flop output signal at a first state in accordance with a transition of said synchronizing signal, said first state being generated when a phase difference between said synchronizing signal and said first signal is positive and when said phase difference is negative, said flip-flop being responsive to said second signal for generating said flip-flop output signal at a second state in accordance with said second signal, said flip-flop output signal alternating between said first and second states within a given period of said synchronizing signal;
a decoder for generating a signal that is indicative of said phase difference at a first state, when said flip-flop output signal is at said first state and said first signal is at a first state, for generating said decoder output signal at a second state, when said flip-flop output signal is at said second state and said first signal is at a second state and for generating said decoder output signal at a third state during the remainder of a given period of said synchronizing signal; and
a low-pass filter responsive to said phase difference indicative signal and coupled to a control input of said oscillator for controlling said oscillator in a phase-lock-loop manner.

13. A phase-lock-loop circuit according to claim 12 wherein both when said phase difference is positive and negative, only one of a rising edge and a falling edge of a given pulse of said synchronizing signal affects said phase difference indicative signal and only one of a rising edge and a falling edge of a given pulse of said first signal affects said phase difference indicative signal.

14. A phase-lock-loop according to claim 13 wherein said edges of said synchronizing and first signals are aligned in steady state phase-lock operation.

15. A phase-lock-loop circuit, comprising:
a controllable oscillator for generating an oscillator output signal;
means responsive to said oscillator output signal for frequency dividing said oscillator output signal to generate a first signal at a lower frequency than that of said oscillator output signal and that is synchronized thereto;
a source of a synchronizing signal containing pulses:
an edge triggered flip-flop responsive to said synchronizing signal for generating a flip-flop output signal at a first state in accordance with an edge of said synchronizing signal, said first state being generated when a phase difference between said synchronizing signal and said first signal is positive and when said phase difference is negative, said flip-flop output alternating between said first state and a second state;

a decoder responsive to said flip-flop output signal and to said first signal for generating at an output of said decoder a decoder output signal that is indicative of said phase difference and that is independent of a duty cycle of said synchronizing signal, said decoder output signal being generated in accordance with a difference between a time when said first state of said flip-flop output signal occurs and a time when said first signal occurs, such that for positive and negative phase differences, no flip-flop other than said flip-flop is used to incorporate timing information from said synchronizing signal into phase difference information of said decoder output signal; and a low-pass filter responsive to said phase difference indicative signal and coupled to a control input of said oscillator for controlling said oscillator in a phase-lock-loop manner.

16. A phase-lock-loop circuit according to claim 15 wherein in steady state phase-lock operation, an edge of said oscillator output signal is aligned to occur substantially simultaneously with an edge of said synchronizing signal.

17. A phase-lock-loop circuit according to claim 15 wherein said first signal generating means comprises a counter responsive to said oscillator output signal for frequency dividing said oscillator output signal, said counter being coupled to said decoder for providing timing information of an edge of said oscillator output signal.

18. A phase-lock-loop circuit according to claim 17 wherein said counter is coupled to said flip-flop for generating said flip-flop output signal at said second state.

* * * * *